United States Patent [19]

Gagnon et al.

[11] Patent Number: 5,289,344
[45] Date of Patent: Feb. 22, 1994

[54] INTEGRATED-CIRCUIT LEAD-FRAME PACKAGE WITH FAILURE-RESISTANT GROUND-LEAD AND HEAT-SINK MEANS

[75] Inventors: Jay J. Gagnon, Holden; Paul J. Panaccione, Barre, both of Mass.

[73] Assignee: Allegro Microsystems Inc., Worcester, Mass.

[21] Appl. No.: 958,496

[22] Filed: Oct. 8, 1992

[51] Int. Cl.5 .............................................. H05K 7/20
[52] U.S. Cl. ................................ 361/712; 174/52.2; 257/675; 361/814
[58] Field of Search ................. 165/80.3, 185; 174/51, 174/52.2, 52.4; 257/675, 688; 361/386, 387, 388, 389, 421, 814, 704, 707, 712

[56] References Cited

U.S. PATENT DOCUMENTS

| | | | |
|---|---|---|---|
| 3,930,114 | 12/1975 | Hodge | 257/675 |
| 5,057,805 | 10/1991 | Kadowaki | 361/421 |
| 5,146,310 | 9/1992 | Bayan et al. | 257/675 |
| 5,193,053 | 3/1993 | Sonobe | 361/421 |

Primary Examiner—Gerald P. Tolin
Attorney, Agent, or Firm—Blodgett & Blodgett

[57] ABSTRACT

The lead-frame in an integrated circuit package, a standard package designated SOT-89, has a plurality of leads of which at least one is an extension of a die-attach pad. At least one ground wing is formed as an extension of a peripheral portion of the die-attach pad and extends upward to approximately the plane of the top of the die. The ground wing has an upstanding portion and a horizontal portion that are at an angle to each other so as to lock the distal end of the wing in the body of encapsulating resin. An integrated circuit die having at least one electrical connection which is grounded electrically via a terminal and wire bonded to the distal part of the ground wing. A contact surface near the distal end of wing is positioned approximately in the plane of the top of the die. This ground circuit can parallel and can be redundant to a ground circuit through the die via the conductive bond that attaches the bottom of the die to the die-attach pad. The ground lead that is an extension of the die-attach pad serves both to remove heat from the die and to provide an electrical ground connection. The contact surface of the wing provides a point of ground-wire attachment that does not move relative to the encapsulating resin as do other peripheral parts of the die attach pad during temperature cycling and mechanical stress. Thus, a common failure mode, which is called heal-cracking, is substantially eliminated.

9 Claims, 7 Drawing Sheets

INTEGRATED-CIRCUIT LEAD-FRAME PACKAGE WITH FAILURE-RESISTANT GROUND-LEAD AND HEAT-SINK MEANS

FIELD OF THE INVENTION

A lead frame design for use in integrated circuit package SOT-89 in which the ground wire is connected from the circuit to a novel ground wing extending from the die-attach pad.

BACKGROUND OF THE INVENTION

This invention relates to an integrated circuit package having one or more lead-frame leads serving both as a ground lead and heat sink means, and more particularly pertains to such a package in which the one or more leads are an extension of and thus are connected to the die-attach pad and are connected electrically via a wire to a terminal on the top die surface.

In packages of the prior art, especially those at the heart of which is an integrated circuit die including logic and power devices, it is known to provide a terminal on the top surface of the die that is connected electrically via a fine connecting wire (commonly, of gold, aluminum, or copper) to one lead of a lead frame, wherein that lead extends directly from the die support pad of the lead frame. That one lead will be able to conduct heat from the bottom of the die to the printed wire board circuitry to which that lead would normally be attached by soldering and the like, and thus the lead serves the dual purpose of removing heat and also provides an electrical connection to the terminal at the top of the die. A molded resin body encapsulates the die, the proximal end of all of the lead-frame leads, and all of the fine wire connections between die and proximal ends of the leads.

In the package which is the subject of this invention, namely the SOT-89 package, the prior art practice was that the fine wire lead from the above-mentioned die terminal connects the terminal directly to the proximate end of the lead-frame ground lead which extends from the die attach pad. This design of SOT-89 package has been found to be prone to an unacceptable failure rate after repeated temperature cycling typical of the normal use environment. Temperature cycling tests have indicated that the high failure rate is due to occurrence of a wedge bond (heel) failure of the grounding wire that is used for these devices. The failure mode was identified as a rupture or fracture occurring at the heel of the bond located on the lead frame, particularly on the die pad periphery, on or near the ground lead. Experimental observations indicated that the mechanism of the bond fatigue failure is plastic flow and rupture in the heel area induced by cumulative cyclic strain during thermal fluctuations. The identified failure mechanism can briefly be described as follows: i) An excessive reduction in the heel cross-sectional area, accompanied by plastic deformation, is caused by the edge of the bonding tool. ii) The bond knee, which represents the junction between the heel and the wire span, sustains high localized stress by virtue of stress concentration effects. iii) This stress will be intensified by the superimposed molding stress. iv) As the package undergoes temperature changes under temperature cycling conditions the heel is displaced. The displacement has both a horizontal and a vertical component. The horizontal component results from the shear force which is due to thermal coefficient mismatch between the molding compound and the lead frame, while the vertical component results from the molding compound normal stress. v) Due to very low yield strength and high ductility of the wire, the displacement will produce a large amount of plastic strain, i.e., permanent deformation, at the knee for each temperature cycle. This plastic strain will accumulate during the course of the temperature cycling. vi) In addition, during the high-temperature part of the cycle, a significant reduction in the wire yield strength could occur and the wire can behave as a perfectly plastic material which will yield a very large cyclic strain at the knee and the molding compound interface. vii) As the plastic straining continues and the cumulative magnitude of cyclic plastic strain reaches critical value (wire fracture strength), the heel will rupture at the knee and a fatigue crack can initiate, marking the beginning of the bond failure.

These and other difficulties experienced with the prior art devices have been obviated in a novel manner by the present invention.

It is an object of this invention to provide an integrated circuit lead-frame package having one or more simple low resistance ground-lead and heat-sink means and having a high tolerance to repeated temperature cycling.

SUMMARY OF THE INVENTION

An integrated-circuit package of this invention includes an integrated circuit die having an electrical terminal on a top face thereof. A sheet-metal lead frame includes a die-attach pad and at least one lead extending away from the die-attach pad. The die is preferably attached to the pad and makes thermal contact therebetween. One or more of the leads are extensions of the die attach pad and provide a low thermal resistance path between the die and the distal ends of the one or more leads, and also may provide an electrical path between die bottom and the distal ends of the one or more leads.

The lead frame also includes one or more ground wings having a first portion that is a continuation of and extends from the pad, a second portion extending at an upward angle from the end of the first portion and a third portion which has a top surface which is substantially coplanar with the top of the die. A fine metal wire, e.g. gold wire, electrically connects the terminal on the die to the top surface of the wing. A solid resin body encapsulates the die, the pad, the ground wing, the proximal portions of the leads and the wire, leaving the distal ends of all the leads extending outside of and away from the body.

As mentioned above, it has been discovered that integrated-circuit lead-frame packages that include one or more leads connected to the die-attach pad which serves as a heat-sink ground tab and that employ a wire-bond from the top of the die to the ground lead at the periphery of the die attach pad, fail at a high rate after several hundred temperature cycles.

This invention recognizes that, even when the temperature coefficient of expansion of the lead frame metal and that of the solid resin body are nearly the same, their thermal time constants are not. Therefore, changes in temperature of the resin-encapsulated metal lead frame parts occur before the temperature of the solid resin body experiences the same change, and this results in physical movement and displacement between peripheral parts of the die-attach pad and the originally bonded resin. This displacement is most severe at the joint of the die-attach pad and the fine wire, and catastrophic failure of that joint occurs after repeated temperature cycles at that joint even though not at the other wire-bond-to-lead-frame joints. The displacement is especially severe when the die attach pad is an extension of a lead that extends outside of the package, and even more particularly, when that lead is not completely encircled by resin where the lead leaves the package. The physical, structural, and positional aspect of the top surface of the distal end of the ground wing or wings of this invention effectively neutralizes the destructive forces of thermal cycling as far as the wire-to-wing bond is concerned.

That top section of the distal end of the wing is the optimum location for the fine-wire attach point, because there is apparently little or no movement there between metal and the encapsulating resin. Thus there is little or no wire joint fatigue and fracture after multiple temperature cycles. It also permits improved wire dress and is an arrangement of the wires to optimize ease of connection, because all wire bonding between the die and the wing (and the other leads) is made in one plane. Throughout this description, it will be understood, by those skilled in the art, that the concept that items are in one plane includes a reasonable tolerance, that is, the items are substantially in one plane. Of the various aspects of wire dress, i.e., the layout of the wires, one aspect is particularly important. In the prior art, for example FIG. 1, the geometry of the package requires the wire bond at the die pad and ground lead to be near the base of the die. This generally means that the wire must approach the bond at or near a right angle. This right-angle approach angle is believed by the present inventors to amplify accumulation of cycle-induced stress and thereby encourage failure. The elevated wing design of the present invention allows a well-dressed wire to approach the wing bond at a very low (small) angle. This small approach angle has been found by the present inventors to be less prone to failure.

The use of more than one wing and a fine wire ground connection to each is also feasible. Separate wings may be used to provide separate wire ground connections from each of several electrical connections on the die. Likewise several wires can go, from the same or separate points on the die, to a single wing. Integrated circuit packages employing this invention offer substantially greater reliability with respect to temperature cycling and mechanical stress. Separate wings also provide an option for optimal match of die-to-lead-frame wiring scheme. For example, the scheme allows avoidance of close or crossing wire paths, which, if present, could cause short circuits with the minimal wire movement which occurs during encapsulation or thermal or mechanical cycling.

BRIEF DESCRIPTION OF THE DRAWINGS

The character of the invention, however, may be best understood by reference to one of its structural forms, as illustrated by the accompanying drawings, in which.

DESCRIPTION OF THE PREFERRED EMBODIMENTS

Figure 1:
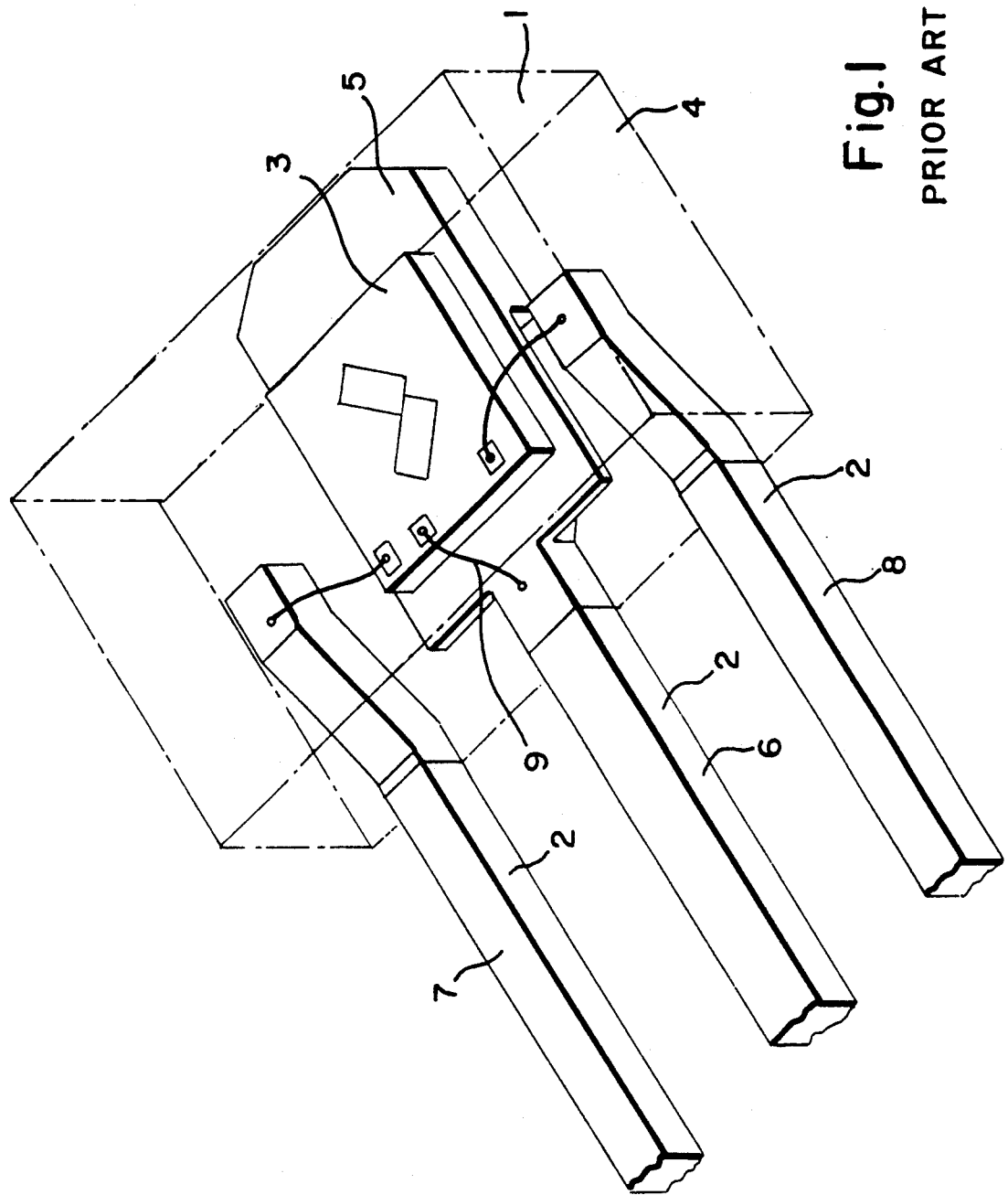
FIG. 1 shows a perspective view of an SOT-89 integrated circuit package employing a prior art copper lead frame carrying an integrated circuit die mounted thereto, and encased in a resin body, which is shown in the drawing in a transparent form but which would normally be opaque in actual use.
Figure 13:
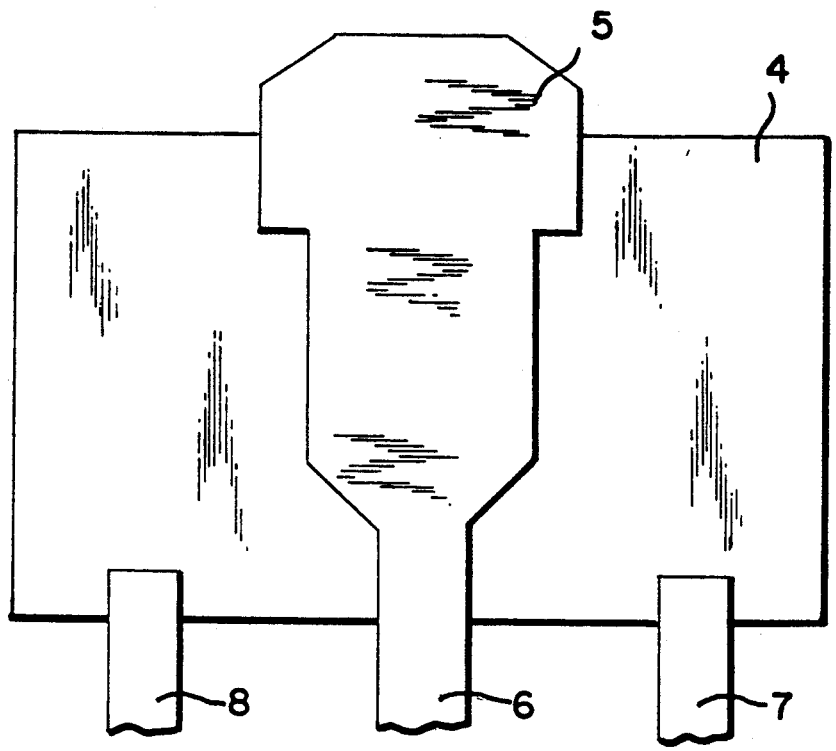
FIG. 13 shows a bottom view of an SOT-89 integrated circuit package employing a prior art copper lead frame carrying an integrated circuit die mounted thereto, and encased in a resin body, which is shown in the drawing in an opaque form normal in actual use.
Figure 14:
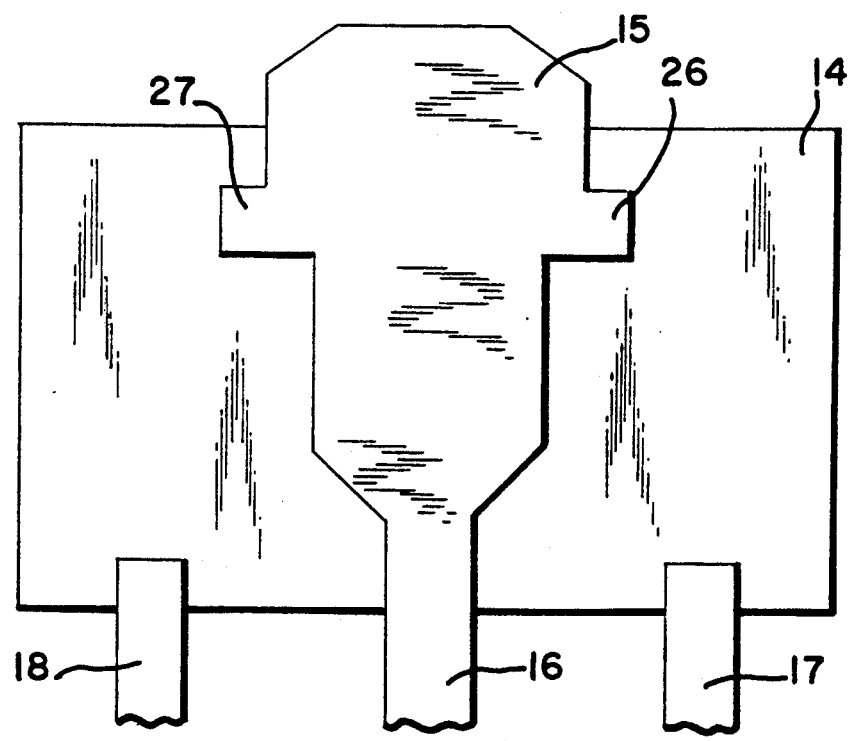
FIG. 14 shows a bottom view of an SOT-89 integrated circuit package employing a copper lead frame embodying the principals of the present invention, and carrying an integrated circuit die mounted thereto, and encased in a resin body, which is shown in the drawing in an opaque form normal in actual use.

Referring first to FIG. 1, wherein are best shown the general features of prior art SOT-89 integrated circuit package, the package, generally denominated by the numeral 1, is shown to include a lead frame 2, an integrated circuit die 3 mounted on the lead frame 2, and an encapsulating body 4, which encapsulates the die 3 and portions of the lead frame 2. In order to most clearly present the subject matter of this description, the drawings in the disclosure are presented as if the body 4 is transparent, except where otherwise noted (namely FIG. 13 and 14). In this way the important positional relationships can be most clearly portrayed. Of course, the body would normally be opaque in the actual product. The lead frame 2 is comprised of a die pad 5 with a ground lead 6 extending from it, and two other leads 7 and 8, which are not directly connected to the die pad 3. The proximal ends of each lead 6, 7, and 8 are positioned inside the body, while the distal ends of each lead are positioned outside of the body. Of critical importance, in the prior art device, a ground wire 9 is bonded to a ground terminal on the top surface of the die and to a ground point in the vicinity of the boundary between the die pad and the proximal end of the ground lead. This location near the ground point is where the thermal-cycle or mechanical-stress failures appear to occur.

Figure 2:
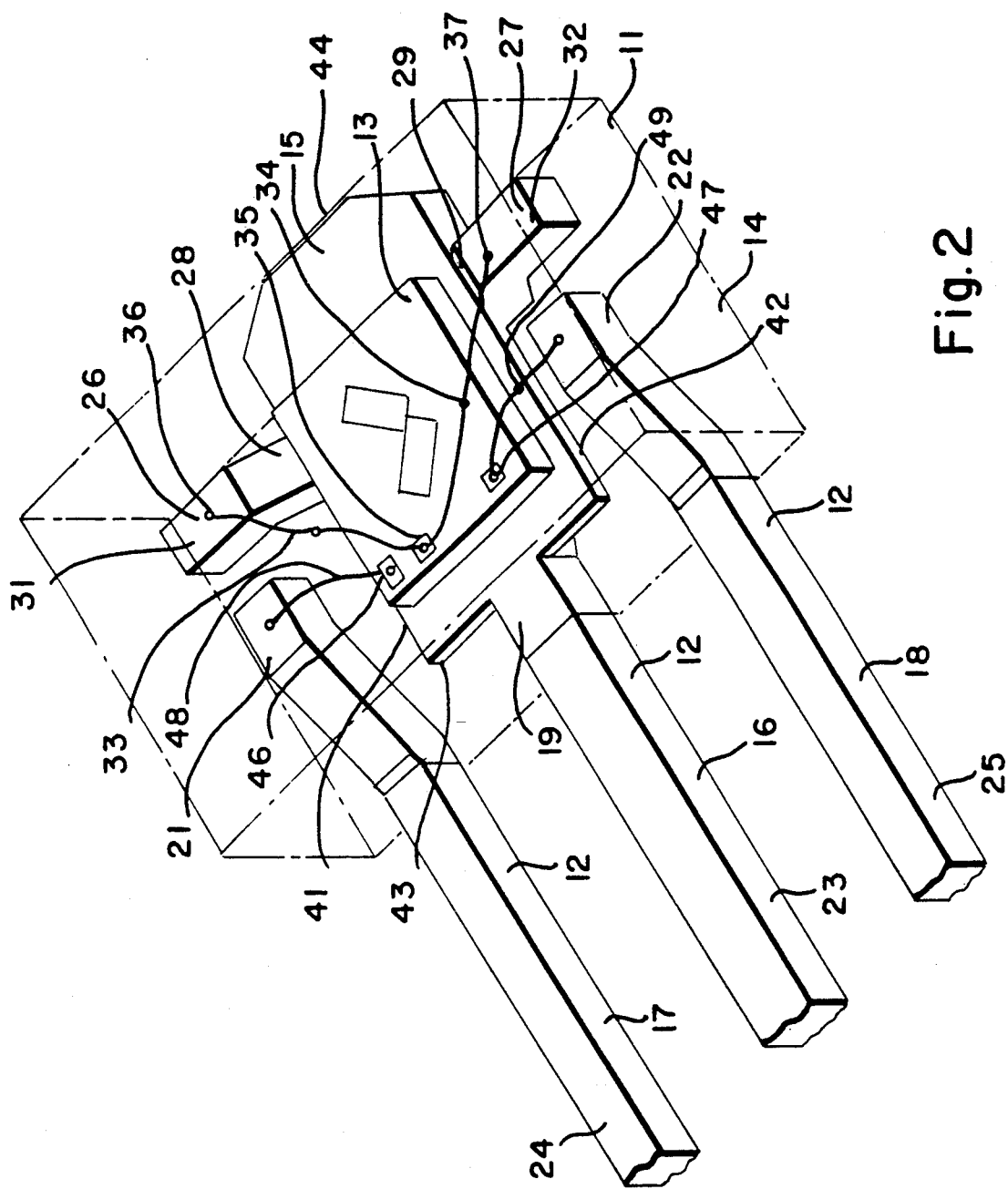
FIG. 2 shows a perspective view of an SOT-89 integrated circuit package employing a copper lead frame embodying the principals of the present invention, and carrying an integrated circuit die mounted thereto, and encased in a resin body, which is shown in the drawing in a transparent form, but which would normally be opaque in actual use.
Figure 3:
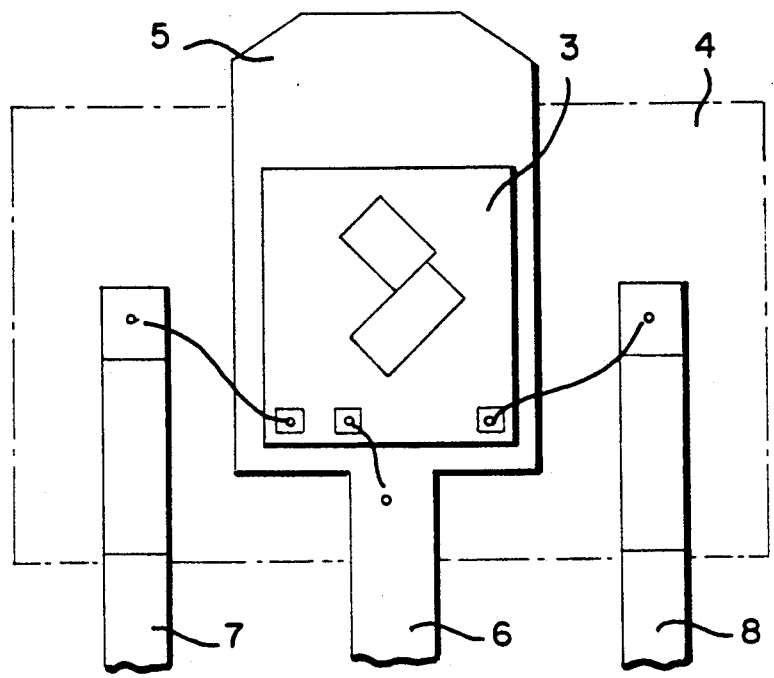
FIG. 3 shows a plan view of an SOT-89 integrated circuit package employing a prior art copper lead frame carrying an integrated circuit die mounted thereto, and encased in a resin body, which is shown in the drawing in a transparent form but which would normally be opaque in actual use.
Figure 4:
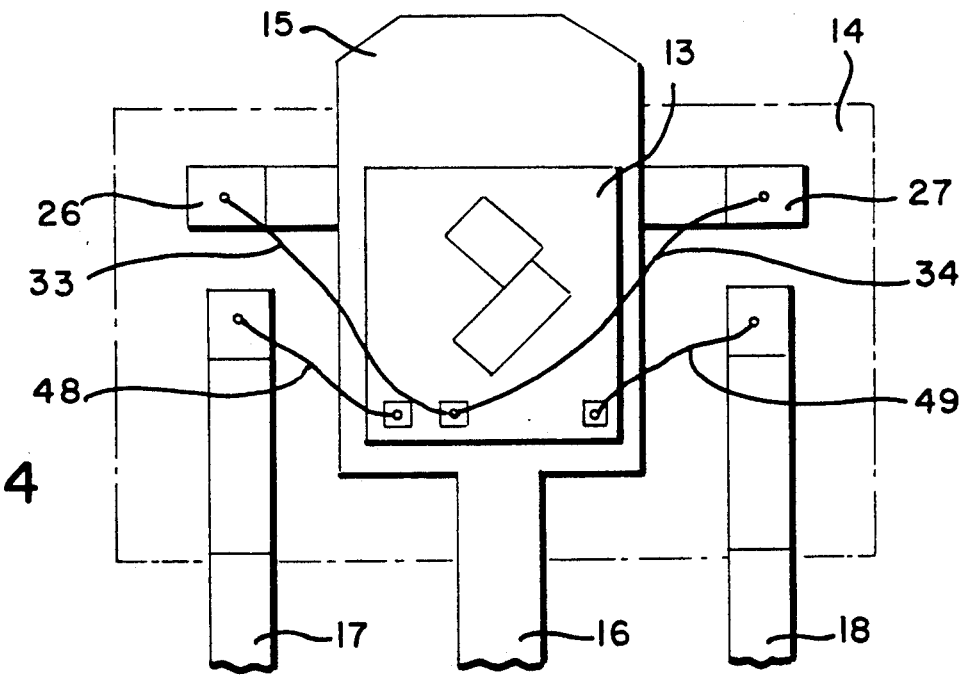
FIG. 4 shows a plan view of an SOT-89 integrated circuit package employing a copper lead frame embodying the principals of the present invention, and carrying an integrated circuit die mounted thereto, and encased in a resin body, which is shown in the drawing in a transparent form, but which would normally be opaque in actual use.
Figure 5:
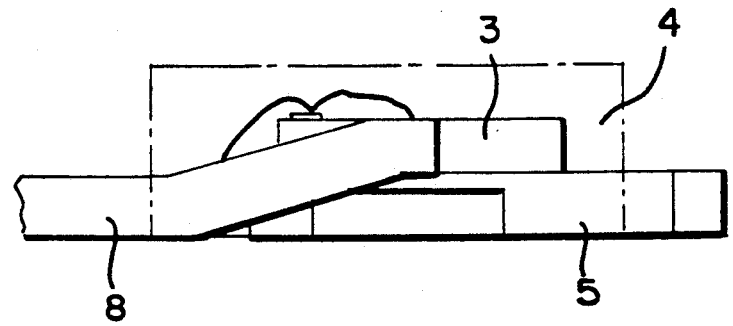
FIG. 5 shows a right elevation view of an SOT-89 integrated circuit package employing a prior art copper lead frame carrying an integrated circuit die mounted thereto, and encased in a resin body, which is shown in the drawing in a transparent form but which would normally be opaque in actual use.
Figure 6:
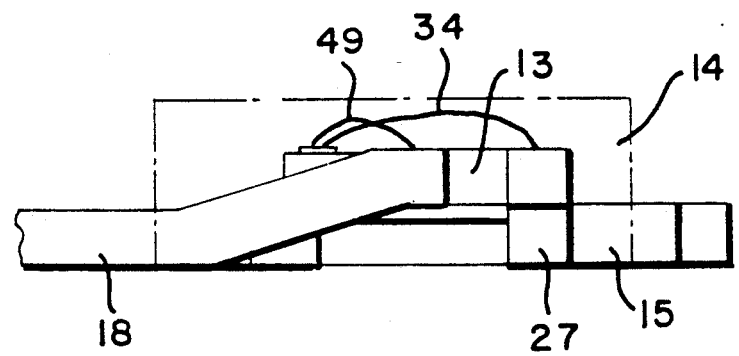
FIG. 6 shows a right elevation view of an SOT-89 integrated circuit package employing a copper lead frame embodying the principals of the present invention, and carrying an integrated circuit die mounted thereto, and encased in a resin body, which is shown in the drawing in a transparent form, but which would normally be opaque in actual use.
Figure 7:
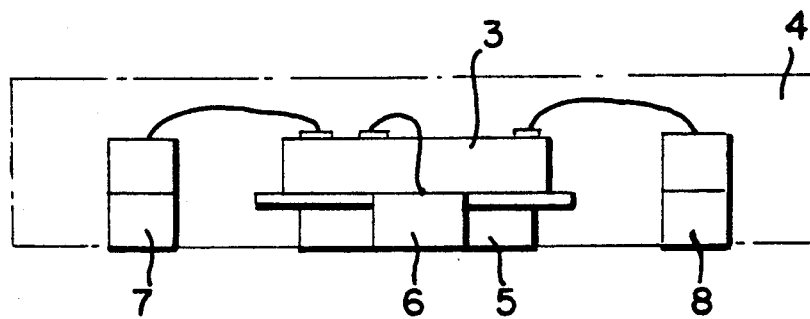
FIG. 7 shows a front elevation view of an SOT-89 integrated circuit package employing a prior art copper lead frame carrying an integrated circuit die mounted thereto, and encased in a resin body, which is shown in the drawing in a transparent form but which would normally be opaque in actual use.
Figure 8:
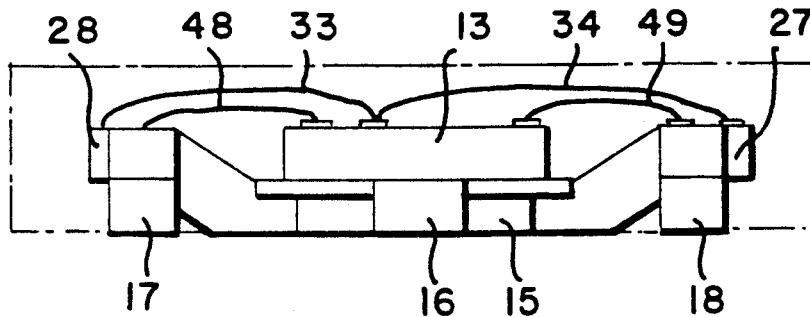
FIG. 8 shows a front elevation view of an SOT-89 integrated circuit package employing a copper lead frame embodying the principals of the present invention, and carrying an integrated circuit die mounted thereto, and encased in a resin body, which is shown in the drawing in a transparent form, but which would normally be opaque in actual use.
Figure 9:
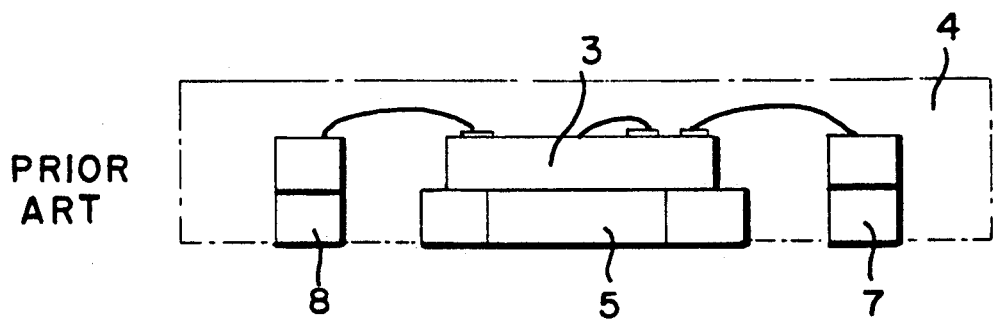
FIG. 9 shows a rear elevation view of an SOT-89 integrated circuit package employing a prior art copper lead frame carrying an integrated circuit die mounted thereto, and encased in a resin body, which is shown in the drawing in a transparent form but which would normally be opaque in actual use.

Referring next to FIG. 2, wherein are best shown the general features of an SOT-89 integrated circuit package which embodies the principals of the present invention, the package, generally denominated by the numeral 11, is shown to include a lead frame 12, an integrated circuit die 13 mounted on the lead frame 12, and an encapsulating body 14, which encapsulates the die 13 and portions of the lead frame 12. The lead frame 12 is comprised of a die pad 15 with a ground lead 16 extending from it, and two other leads 17 and 18, which are not directly connected to the die pad 13. The proximal ends 19, 21, and 22 of each lead 16, 17, and 18, respectively, are positioned inside the body, while the distal ends, 23, 24, and 25 of each lead 16, 17, and 18, respectively, are positioned outside of the body. Of critical importance, in the present device, one or more ground wings 26 and 27, which extend laterally from the sides 41 and 42 of the die pad 15 from proximal end 28 and 29 to a distal end 31 and 32 that is within the body. While the preferred embodiment would have two wings and they would extend from opposite side edges 41 and 42 of the pad 15, one wing could be sufficient in appropriate circumstances and it (or they) could extend from either side edge 41 and 42 or from the front edge 43 or back edge 44 of the pad 15. One or more ground wires 33 and 34 are bonded to a ground terminal 35 on the top face or surface 45 of the die and to a ground point 36 and 37 in the vicinity of the distal end of one or more of the wings. With the ground point 36 and 37 in this location, dramatic reductions in thermal-cycle or mechanical stress failures have been found to occur.

The lead frame 12 is made by selectively removing portions of a uniformly thick copper sheet, e.g. by punching or chemical etching. A silicon integrated circuit die 13 is mounted to a die-attach pad 15. In the preferred embodiment, all wire bonding to the top of the die and the top surface of the proximal portions 21 and 22 of the signal leads and to the distal end 31 and 32 of the wings may be made all in one plane, a significant advantage in manufacturing. The die is attached to the top surface of the pad 15 by use of a layer of adhesive or a soft solder or other medium. This provides the desired combination of mechanical and/or thermal and/or electrical contact therebetween.

To establish scale, the distal ends 23, 24, and 25 of leads 16, 17, and, 18 are spaced apart on 0.059 inch centers. The resin body 14 is 0.1 inches deep, 0.18 inches wide, and 0.06 inches high.

Prior to encapsulating, the copper lead frame 12 has a web between each pair of adjacent leads 16, 17, and 18. After body 14 is formed, preferably by molding, the webs, located just outside the resin body 14, are removed.

The die 13 has a plurality of circuit terminals 35, 46, and 47 on the top surface thereof. Fine gold wires 33, 34, 48, and 49 connect the terminals 46 and 47 to the proximal ends 21 and 22 of the lead-frame leads 17 and 18, and terminal 35 with the distal ends 31 and 32 of the wings 26 and 27 which extend directly from the side or sides of the die-attach pad 15.

Figure 10:
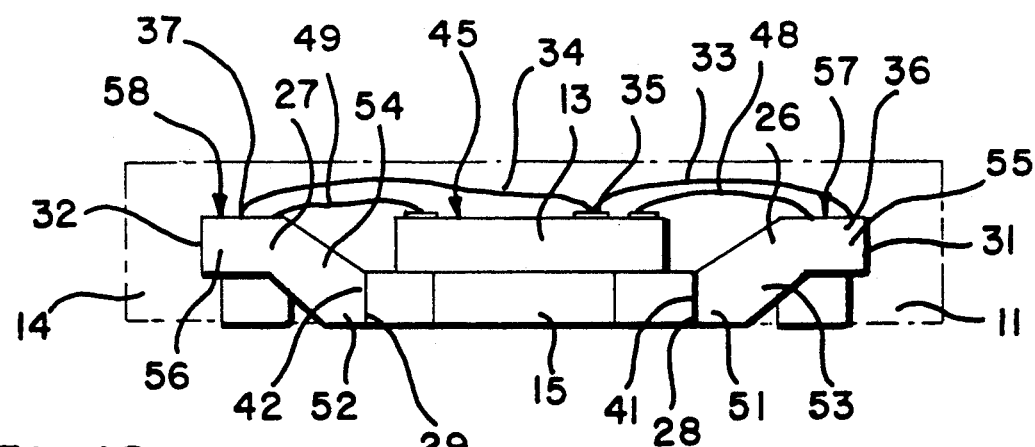
FIG. 10 shows a rear elevation view of an SOT-89 integrated circuit package employing a copper lead frame embodying the principals of the present invention, and carrying an integrated circuit die mounted thereto, and encased in a resin body, which is shown in the drawing in a transparent form, but which would normally be opaque in actual use.
Figure 11:
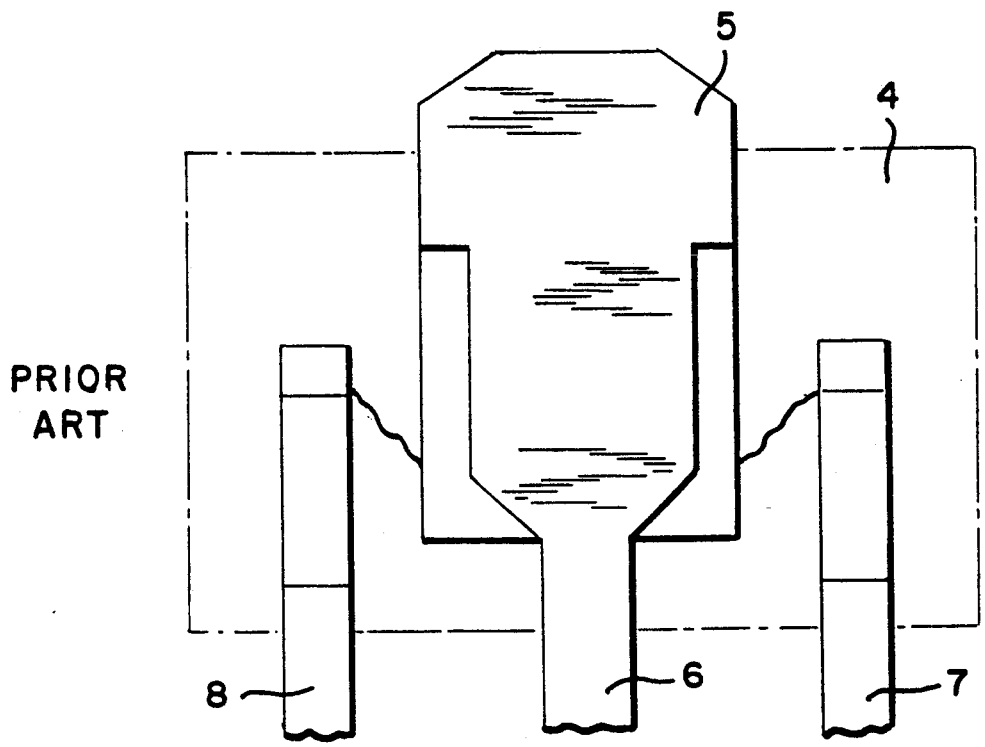
FIG. 11 shows a bottom view of an SOT-89 integrated circuit package employing a prior art copper lead frame carrying an integrated circuit die mounted thereto, and encased in a resin body, which is shown in the drawing in a transparent form but which would normally be opaque in actual use.
Figure 12:
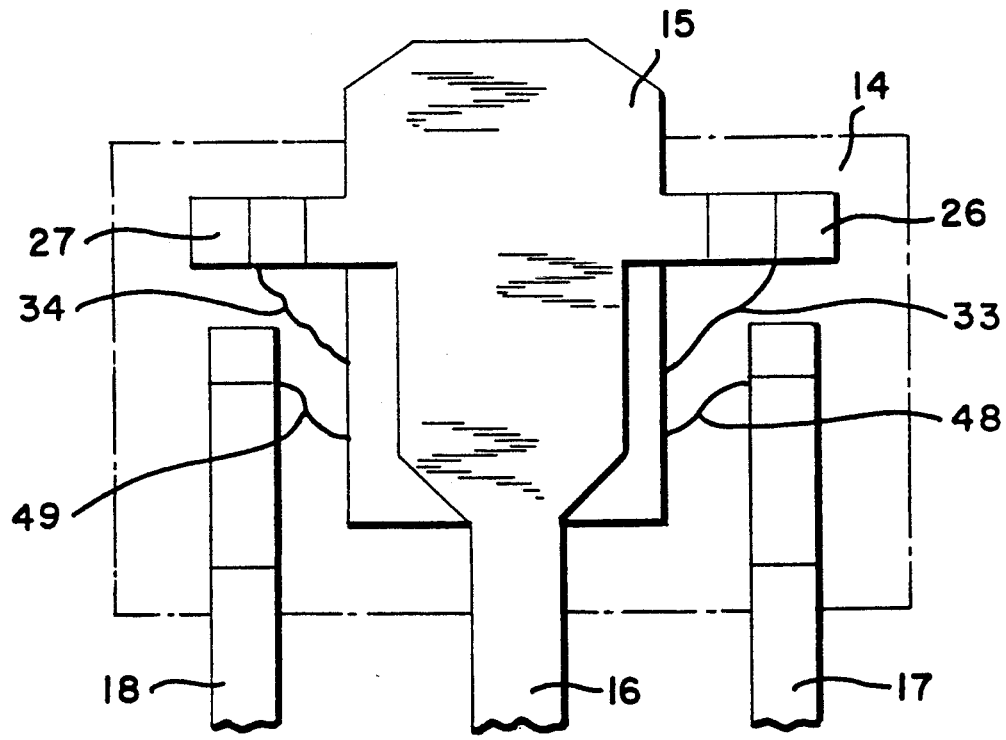
FIG. 12 shows a bottom view of an SOT-89 integrated circuit package employing a copper lead frame embodying the principals of the present invention, and carrying an integrated circuit die mounted thereto, and encased in a resin body, which is shown in the drawing in a transparent form, but which would normally be opaque in actual use.

Referring to FIG. 10, which is a rear elevation view of the package, each ground wing 26 and 27 has a first portion 51 and 52 that leaves a side 41 and 42 of the die-attach pad 15 and extends laterally. A second or standup portion 53 and 54 of the wing extends at about a forty-five degree angle from the first portion 51 and 52 and extends the wing upward in the body. A third or contact point portion 55 and 56 extends horizontally from the outboard end of the second portion and forms a top surface 57 and 58 which, in turn, forms a contact point 36 and 37, in the plane of the top face 45 of the die 15 and near the distal end 31 and 32 of the wing 26 and 27. The distal end 31 and 32 of the wing 26 and 27 (or wings) is encapsulated within the body 14. Those figures not specifically recited in this section are described in the section entitled "BRIEF DESCRIPTION OF THE DRAWINGS" in sufficient detail to enable one of ordinary skill in the art to understand the views of the invention which those figures present. In order to avoid unnecessary repetition, those descriptions are incorporated by reference into this section.

While the wing shape recited above is the preferred embodiment of this invention and provides results which are vastly superior to alternatives, the scope of the invention includes two variations. In certain situations, it would be acceptable to have a planar dog-leg wing which simply extends outward from the side of the pad, in the plane of the pad, and then angles sideways in the plane of the pad to form a distal branch. This forms a dog-leg or hook which anchors the wing in the resin. The wire would be connected to the distal branch. Similarly, in certain situations, it would be acceptable if the wing were a simple tab extending outward from the side of the pad and in the plane of the pad. The wire would be joined to the tab at a point spaced from the proximal end of the tab. In all three versions, a hole may be formed near the distal end to provide additional anchoring in the resin.

To test the effectiveness of the present invention, a control batch of integrated circuit packages were made in accordance with the prior art design shown in FIG. 1. More specifically, they were made without ground wings, but with gold ground return wire connected between the die and periphery of the die-attach pad near the connection between the pad and the ground lead. A large number of such packages were subjected to a standard temperature cycling test operating between −65 degrees C. and 150 degrees C. to which present day power IC packages are commonly subjected, with the result that a high rate of failures was observed after five hundred cycles. This is a commercially unacceptable failure rate. Analysis of the failed parts showed "heal-cracking", i.e., fracturing of the gold wire joint at the die-attach pad.

The integrated circuit package of this invention, illustrated in the FIG. 2, has a ground wing and/or wings 26 and 27 to which the gold leads are bonded within the top surface area of the third wing portion 55 and 56 or near the distal end area of the wing. This is the wing region that is locked into the resin so that no separation between resin and copper occurs there during temperature cycling. The non-steady-state thermal expansion differential which apparently exists between the pad and resin adjacent to the pad does not apparently occur at the distal end of the wings and is apparently absorbed by the vertical orientation of the standup portion. Because the contact point on the wing is near and approximately in the same plane as the top face of the die, the wire dress of the fine wire 33 and 34 is optimized. A large number of packages so made show no failures after 3000 cycles of the above-mentioned temperature cycling test. This is a commercially acceptable failure rate.

It will be understood by those in the art that the term "ground" is used herein in the sense of a "common" connection. It is not necessarily at zero voltage.

It is obvious that minor changes may be made in the form and construction of the invention without departing from the material spirit thereof. It is not, however, desired to confine the invention to the exact form herein shown and described, but it is desired to include all such as properly come within the scope claimed.

The invention having been thus described, what is claimed as new and desired to secure by Letters Patent is:

1. An integrated-circuit package comprising:
   (a) a semiconductor integrated-circuit die having two major faces, a top face and a bottom face, said die having at least one electrical circuit ground terminal on the top face and at least one electrical signal terminal on the top face,
   (b) a lead frame comprising:
   (i) a die-attach pad, having a top face, a bottom face, a front side, a back side, a right side, and a left side, the bottom die face of the die being bonded to the top face of said die-attach pad to provide a physical and thermal connection between said die and said pad,
   (ii) at least one ground lead extending away from the front side of said die-attach pad, said lead having a proximal end attached to said pad and a distal end, and
   (iii) at least one ground wing, separate from the ground lead, and extending from said pad, said wing having a proximal end attached to said pad, a distal end, and a contact surface spaced from the proximal end of the wing,
   (c) at least one wire forming a direct electrical connection between the contact surface of said ground wing and said electrical ground terminal on said top die face, and
   (d) a solid electrically insulating body encapsulating said die, the proximal end of said ground lead, the distal end of said ground wing, and said at least one wire, so that said ground lead is enabled to function as heat-sink ground tab conducting heat and electrical current from said die to the outside of said body.

2. The integrated-circuit package of claim 1, wherein the point of attachment of said wire to said ground wing lies on a top-surface of said wing near the distal end of said ground wing.

3. The integrated-circuit package of claim 1, wherein the point of attachment of said wing to said pad lies on one of the side edges of the pad.

4. The integrated-circuit package of claim 1, wherein the wing has a distal portion adjacent the distal end of the wing, said distal portion having a top surface, and said at least one wire is electrically connected to the top surface.

5. The integrated-circuit package of claim 1, wherein a top face of said die and said top face of said contact surface of said distal end of said wing lie approximately in one plane.

6. The integrated-circuit package of claim 1, wherein the wing includes a standup portion which routes the wing from the point where its proximal end contacts the pad approximately up to the plane of the top face of the die.

7. The integrated-circuit package of claim 1, wherein two wings are provided.

8. The integrated-circuit package of claim 1, wherein two wings are provided and attached to opposite edges of the pad.

9. The integrated-circuit package of claim 1, additionally comprising a plurality of conductive wire forming electrical connections between said proximal ends of some of said leads and several circuit terminals, respectively, on said top die face.

* * * * *